(12) United States Patent
Wang et al.

(10) Patent No.: US 8,862,089 B2
(45) Date of Patent: Oct. 14, 2014

(54) CIRCUIT FOR A FRONT-END TUNABLE FILTER OF A COMMUNICATION AND BROADCAST RECEIVER AND A TUNING METHOD THEREOF

(71) Applicants: Han Wang, Beijing (CN); Yi Yang, Beijing (CN); Zhen Li, Beijing (CN); Pei Yang, Beijing (CN); Dianyu Chen, Beijing (CN); Haiqing Lin, Ladera Ranch, CA (US); Yihai Xiang, Rancho Santa Margarita, CA (US); Zhongzhi Liu, Beijing (CN)

(72) Inventors: Han Wang, Beijing (CN); Yi Yang, Beijing (CN); Zhen Li, Beijing (CN); Pei Yang, Beijing (CN); Dianyu Chen, Beijing (CN); Haiqing Lin, Ladera Ranch, CA (US); Yihai Xiang, Rancho Santa Margarita, CA (US); Zhongzhi Liu, Beijing (CN)

(73) Assignee: Beijing KT Micro, Ltd., Beijing (CN)

( * ) Notice: Subject to any disclaimer, the term of this patent is extended or adjusted under 35 U.S.C. 154(b) by 48 days.

(21) Appl. No.: 13/655,264

(22) Filed: Oct. 18, 2012

(65) Prior Publication Data

US 2013/0040595 A1    Feb. 14, 2013

Related U.S. Application Data

(63) Continuation of application No. PCT/CN2011/072655, filed on Apr. 12, 2011.

(30) Foreign Application Priority Data

Apr. 21, 2010    (CN) .......................... 2010 1 0151252

(51) Int. Cl.
*H04B 1/10* (2006.01)
*H04B 1/16* (2006.01)
*H03H 7/01* (2006.01)
*H04B 1/18* (2006.01)

(52) U.S. Cl.
CPC ............... *H04B 1/18* (2013.01); *H03H 7/0153* (2013.01); *H03H 7/17* (2013.01); *H03H 2210/04* (2013.01)
USPC ........................... 455/334; 455/307; 455/340

(58) Field of Classification Search
CPC .......... H04B 1/10; H04B 1/18; H03H 7/0153; H03H 7/1775; H03H 2210/04; H03J 5/244; H03J 3/20; H03J 2200/08
USPC .......................... 455/291, 307, 334, 339, 340
See application file for complete search history.

(56) References Cited

U.S. PATENT DOCUMENTS

| 5,678,211 | A  | * | 10/1997 | Badger ........................ 455/191.1 |
| 6,778,023 | B2 | * | 8/2004 | Christensen .................... 331/16 |
| 6,978,125 | B2 | * | 12/2005 | Lindell et al. ................ 455/183.1 |

(Continued)

FOREIGN PATENT DOCUMENTS

| CN | 1965471 A | 5/2007 |
| CN | 101454985 A | 6/2009 |
| CN | 101931426 A | 12/2010 |

*Primary Examiner* — Simon Nguyen
(74) *Attorney, Agent, or Firm* — J.C. Patents (57) ABSTRACT

A circuit for a front-end tunable filter of a communication and broadcast receiver and a tuning method thereof are described herein. In one aspect, the circuit of the tunable filter may be independent of the signal reception link of the receiver. The pre-filter (104) includes a variable capacitance (146) which is adjusted by a tuning signal (160). A negative resistance element (144) and the pre-filter (104) may form an oscillator. The negative resistance element (144) is controlled by an amplitude control signal (162) outputted from an oscillation amplitude control circuit (142). The oscillation amplitude control circuit (142) stabilizes the amplitude of a radio frequency signal (130) in a preset range. An oscillation frequency control circuit (140) stabilizes the frequency of the signal (130) in a preset frequency range by a tuning signal (160). The tuning is completed until both of the amplitude and the frequency of the oscillation signal meet the preset ranges.

10 Claims, 5 Drawing Sheets

(56) References Cited

U.S. PATENT DOCUMENTS

| | | | |
|---|---|---|---|
| 7,236,756 B2* | 6/2007 | McGinn | 455/193.1 |
| 7,634,242 B2* | 12/2009 | Magnusen | 455/196.1 |
| 8,340,616 B2* | 12/2012 | Shah et al. | 455/286 |
| 2007/0123186 A1* | 5/2007 | Asayama et al. | 455/188.1 |
| 2009/0109347 A1* | 4/2009 | Lester et al. | 348/731 |
| 2009/0253395 A1* | 10/2009 | Ikeda et al. | 455/193.1 |

\* cited by examiner

CIRCUIT FOR A FRONT-END TUNABLE FILTER OF A COMMUNICATION AND BROADCAST RECEIVER AND A TUNING METHOD THEREOF

RELATED APPLICATIONS INFORMATION

This application is a continuation of the PCT Application PCT/CN2011/072655 filed on Apr. 12, 2011, which claims priority to Chinese Patent Application No. 201010151252.6, filed on Apr. 21, 2010. The contents of both applications are incorporated herein by reference in its entirety as it set forth in full.

BACKGROUND

1. Technical Field

The embodiments described herein relate to a circuit for a front-end tunable filter of a communication and broadcast receiver and a tuning method thereof.

2. Related Art

The receiver has been widely used in the field of mobile phones, television, broadcast, global positioning system (GPS). For example, radio broadcasting and television signals are distributed in different frequency bands in China. For each corresponding frequency band, each program has its own channel. For example, the FM broadcast RF signals are from 88 MHz to 108 MHz. Each FM channel is 200 KHz.

Table of China's Radio and TV Frequency Allocations

| Wave Band | Frequency (MHz) | Channel Interval | Use |
|---|---|---|---|
| LF (LW) | 120-300 KHz | — | Long wave AM broadcasting |
| MF (AM) | 525 KHz-1605 KHz | 9 KHz | Medium wave AM broadcasting |
| HF (SW) | 3.5-29.7 MHz | 9 KHz | Short wave AM radio and single-side band communication |
| VHF (FM) | 88-108 MHz | 200 KHz | FM broadcasting and data broadcasting |
| VHF | 48.5-92 MHz | 8 MHz | TV and data broadcasting |
| VHF | 167-223 MHz | 8 MHz | TV and data broadcasting |
| UHF | 223-443 MHz | 8 MHz | TV and data broadcasting |
| UHF | 443-870 MHz | 8 MHz | TV and data broadcasting |

The receiver requires the RF signal received by the RF front-end to be transferred to the baseband through one or more stages of frequency conversion for the demodulation processing. For example, in the topology of the two-stage frequency conversion, the received RF signal is first converted to an intermediate frequency for amplification and filtering, and then converted to a baseband for demodulation processing. In the FM broadcasting, for example, the 10.7 MHz is often used as the receiver IF in the FM receiver. First, the RF front-end of the receiver receives a FM broadcast signal. Next, the received signal is converted to 10.7 MHz for filtering; the obtained IF signal can be amplified if necessary. Then, the 10.7 MHz FM signal is further converted to a baseband for demodulation processing by a demodulation circuit. Finally, the broadcast program signal is obtained. Other common receiver topologies also include: a zero IF topology, which directly converts the received RF signal to a baseband for demodulation processing without the IF stage; as well as a multi-IF topology, which ultimately converts the signal to a baseband through multi-stage IF conversion for demodulation processing. The working principles of the other receivers are the same.

Figure 1:
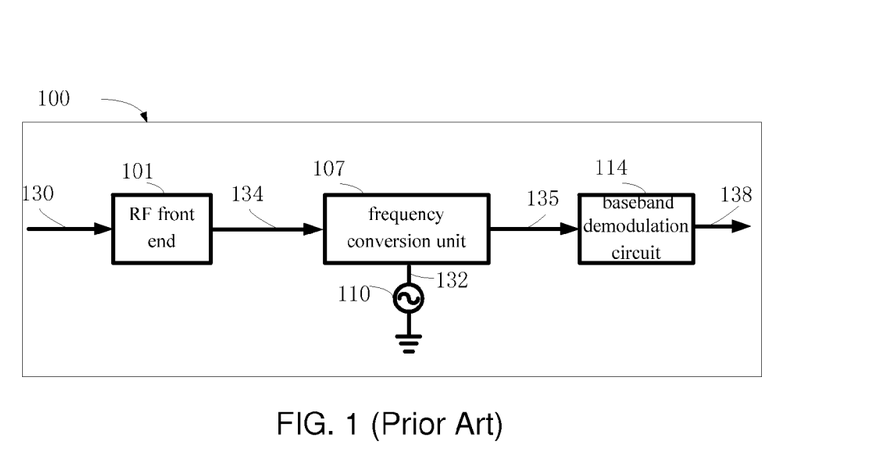
FIG. 1 a circuit diagram showing a wireless receiver system.

FIG. 1 illustrates a receiver system 100. The receiver system includes an RF front end 101, a frequency conversion unit 107, a local oscillation circuit (LO) 110, and a baseband demodulation circuit 114. The RF front end 101 receives a signal 130, a RF signal 134 is obtained after processing; the processing of the input signal 130 by the RF front end 101 may be either a gain processing including amplification or attenuation; or a filtering processing including filtering or attenuation of out of band signal to retain useful signal in the band. The local oscillation circuit 110 generates a tuned local oscillator signal 132 with a frequency of $F_{LO}$. The frequency conversion unit 107 receives the processed RF signal 134 and the local oscillation signal 132, to obtain a baseband signal 135 with a frequency $F_{IF}$. The demodulation circuit 114 demodulates the baseband signal 135 to generate a desired demodulated signal 138.

Figure 2:
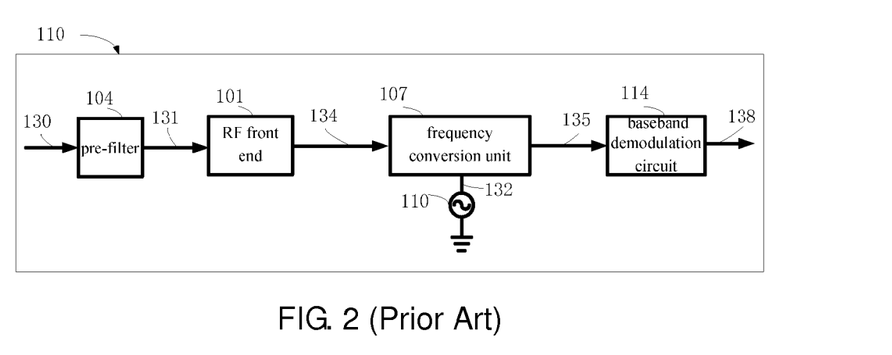
FIG. 2 is a circuit diagram showing a receiver system with a pre-filter.

FIG. 2 illustrates another receiver system 110. The receiver system 110 further includes a pre-filter 104. The pre-filter 104 can selectively filter the input signal 130 according to a pre-determined channel, thus filtering or attenuating the out of band signal. Then the resultant inband signal 131 is input to the RF front end.

Figure 3:
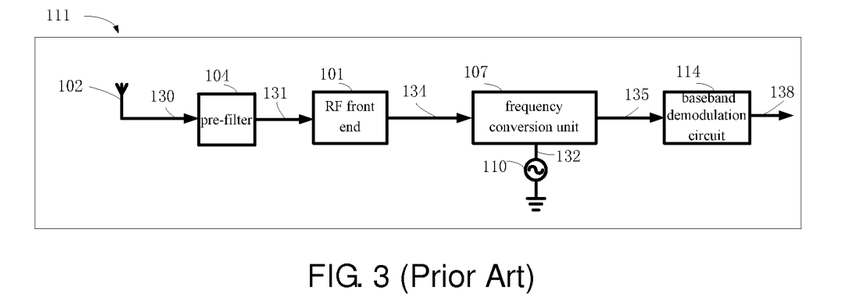
FIG. 3 is a circuit diagram showing a receiver system with an antenna and a pre-filter.

FIG. 3 illustrates another receiver system 111. The receiver system 111 further includes an antenna 102. The antenna receives a wireless RF signal in the air to be filtered. If the antenna is an active antenna, the antenna can have the function of signal amplification. The RF signal 130 is then transmitted to the pre-filter 104. Here, the antenna of the radio receiver can be regarded as a pre-filter, or a part of the pre-filter.

Figure 4:
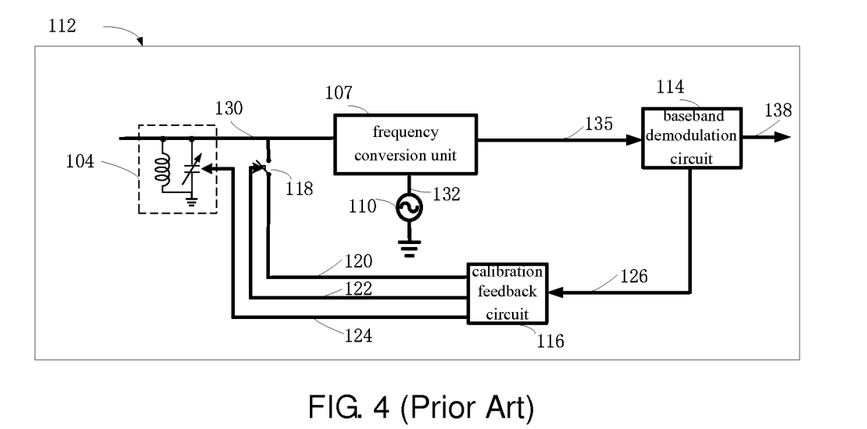
FIG. 4 is a circuit diagram showing a receiver system with a pre-filter tuning control loop.

FIG. 4 illustrates yet another receiver system 112. The receiver system 112 further includes a tuning control loop for the pre-filter 104 to help the receiver to tune to the received programming channel. For this receiver system, when the pre-filter 104 is tuning, in addition to the calibration feedback circuit 116 and the pre-filter 104, the frequency conversion unit 107 and the baseband demodulation circuit 114 module in the signal reception link must also work. The baseband demodulation circuit 114 also needs to generate a feedback signal 126 to the calibration feedback circuit 116. This feedback signal 126 is used to indicate the strength of the RF signal 130 and the frequency deviation. The calibration feedback circuit 116 generates a tuning calibration signal 120 and a tuning control signal 122 according to the feedback signal 126. The tuning control signal 122 controls the switch 118. When the pre-filter is tuning, the switch 118 is on, and the tuning calibration signal 120 is sent to the RF signal 130. The calibration feedback circuit 116 also generates a control signal 124 for the pre-filter 104. The control signal 124 is used to adjust the tunable component value of the pre-filter 104. The pre-filter 104 has different frequency response to the tuning calibration signal 120 with changes in the control signal 124, reflecting in the RF signal 130. As a result, the RF signal 130 reaches the baseband demodulation circuit 114 along the signal reception link. With the calibration feedback circuit 116 and the demodulation circuit 114 continuously adjusting the signals 120, 122, 124 of the calibration feedback circuit, the front filter 104 is ultimately tuned to the optimum frequency desired by the receiver system.

The tuning scheme of the system 112 has the following disadvantages. First, the tuning scheme of the system 112 is dependent on the normal working of the signal reception link.

Secondly, the tuning calibration signal 120 generated by the calibration feedback circuit 116 must have a frequency difference of an intermediate frequency $F_{IF}$ with the local oscillator signal 132. Only in this way can the baseband signal 135 generated by the frequency conversion unit 107 be exactly in the intermediate frequency $F_{IF}$ of the signal reception link in the tuning process. This circuit implementation of this tuning scheme needs an oscillator included in the calibration feedback circuit 116, whose operating frequency is different from the operating frequency of the local oscillator 132 $F_{LO}$ by a frequency $F_{IF}$. Third, this tuning scheme needs separate processing of the baseband signal 135 in the tuning process by the base-band demodulation circuit 114 to generate the desired feedback control signal 126. This portion of the function is an extra to the demodulation function, increasing the cost of the circuit. Fourth, the control loop of the tuning scheme is lengthy and involved a plurality of modules in the signal reception link. As a result, the calibration feedback circuit 116 is subject to many restrictions and is extremely difficult to optimize. Fifth, in this tuning scheme, the design of the calibration feedback circuit 116 is heavily dependent on the structure of the signal reception link resulting in the lack of the independence, reusability, and portability of the calibration feedback circuit 116.

SUMMARY

A circuit for a front-end tunable filter of a communication and broadcast receiver and a tuning method thereof are described herein. The described circuit and method can be applied to the RF circuit of communication and broadcasting receiver.

In one aspect, the tuning calibration circuit of a pre-filter may adopt an active device. The active device and the pre-filter may form a negative resistance oscillator when the receiver needs to tune the pre-filter. The negative resistance oscillator may include at least one controllable tuning device to adjust the oscillation signal frequency. The negative resistance oscillator may include a controllable active device to adjust the amplitude of the oscillator oscillation signal. The oscillation amplitude control circuit of the tuning calibration circuit may detect the oscillation signal, compare the amplitude of the oscillation signal with a preset range, and output a control signal to the oscillator with the signal amplitude of the oscillator being stabilized at a preset range according to the comparison result. The oscillation frequency control circuit of the tuning calibration circuit may detect the oscillation signal frequency, compare the oscillation signal frequency with a preset range, and output a control signal to the oscillator with the oscillation signal frequency being stabilized at a preset range according to the comparison result. As a result, the tuning is complete and the receiver may work properly.

In another aspect, the tuning calibration circuit includes two control loops: a control loop for the oscillation amplitude control circuit, and a control loop for the oscillation frequency control. The former may stabilize the amplitude of the oscillation signal, while the latter may determine the tuning frequency. The two loops may be adjusted relatively independent of each other and do not need the signal reception link to participate in the tuning calibration, resulting in reduced workload in design, reduction of number of iterations and cycles in design debugging, and optimization of the circuit.

The tuning calibration circuit may be independent of the signal reception link and is not dependent on the normal working of the signal reception link. There is no need to process the tuning calibration signal in the signal reception link. As a result, the tuning calibration circuit is independent of the signal reception link, suitable for zero-IF, low-IF, high-IF, multi-IF circuit topology receiver, achieving the independence, reusability and portability for the tuning calibration circuit.

The topology of the tuning calibration circuit is simple, saving hardware costs. There is no need for additional circuit for tuning to output a small signal into an input port. The demodulating circuit may not need to separately process the tuning signal. Moreover, the control loop of the oscillation amplitude may be omitted to further simplify the circuit design.

The tuning calibration circuit may provide gain to the received channel signal.

In another aspect, the two feedback control loops of the tuning calibration circuit may be tightly coupled with the pre-filter. Since the signal reception link is not involved, the feedback loop is short. As a result, the tuning speed is improved while the power consumption is reduced.

Figure 6:
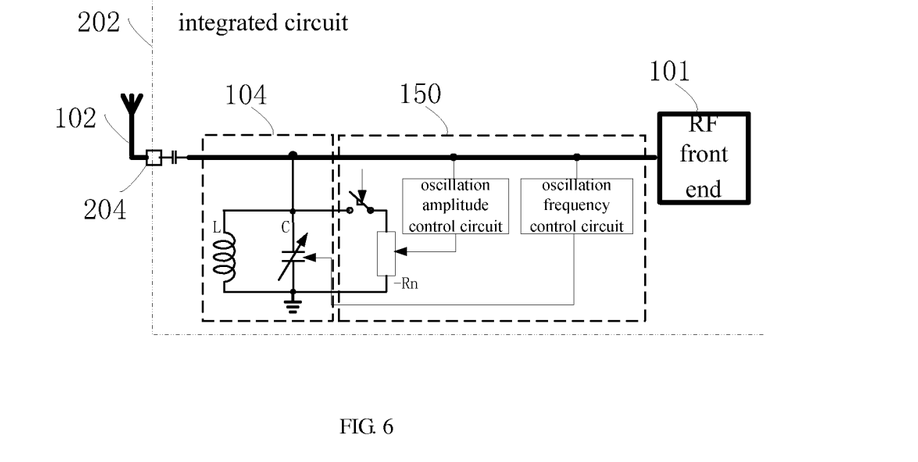
FIG. 6 is a circuit diagram showing the system 200 in FIG. 4 implemented entirely on an integrated circuit.
Figure 7:
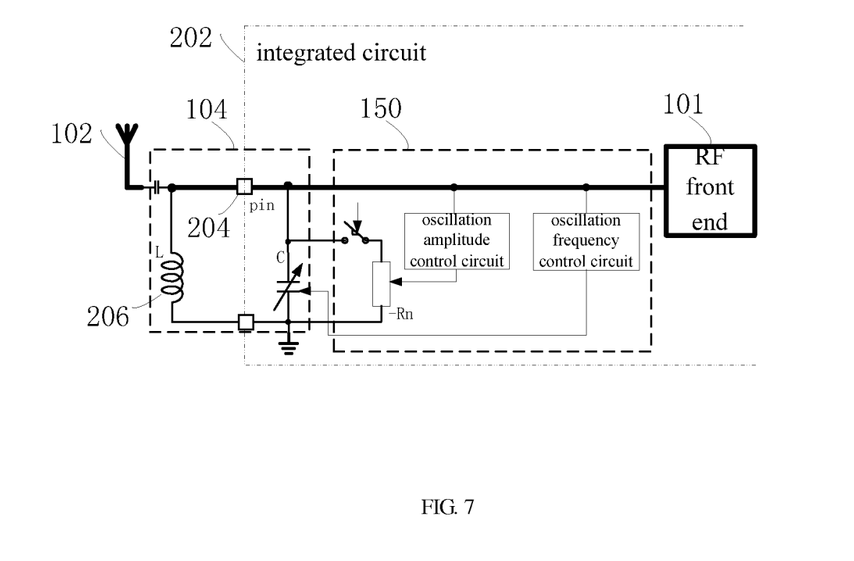
FIG. 7 is a circuit diagram showing the system 200 in FIG. 4 partially implemented on an integrated circuit.

In the present embodiments, the tuning calibration circuit may be implemented by discrete electronic components. Alternatively, the circuit may be also implemented by an integrated circuit, or part of the circuit implemented by an integrated circuit and the others implemented by discrete electronic components. FIG. 6 illustrates a circuit in an integrated circuit according to one embodiment. In particular, the tuning calibration circuit and the pre-filter are in the integrated circuit 202. The external antenna 102 and the wireless receiver may be connected through the integrated circuit pin 204. FIG. 7 illustrates a circuit with portion of the circuit in an integrated circuit according to one embodiment. In particular, the tuning calibration circuit and part of the pre-filter are in the integrated circuit 202. The external antenna 102 and the part of the pre-filter device may be connected with the integrated circuit pin 204.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Referring now to the drawings, a description will be made herein of embodiments herein.

Receiver has been widely used in the field of mobile phones, wireless/cable TV, and GPS navigation. The RF signals, such as FM radio signals, have both the band frequency range (FM radio is from 88 MHz to 108 MHz in China) and the channel interval requirements. For example, the FM radio channel interval in China is only 200 KHz. The embodiments described herein are fully applicable to these signals and other wireless or wired signal receivers to tune to a specific channel.

Figure 5:
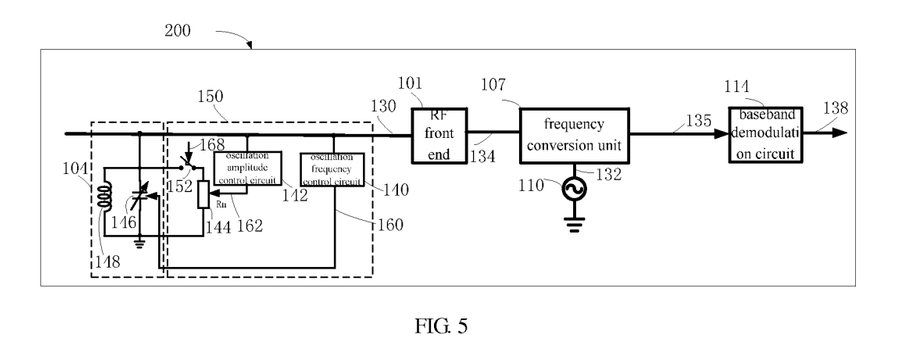
FIG. 5 is a circuit diagram showing a receiver system with a pre-filter tuning control loop according to one embodiment.

FIG. 5 illustrates a system 200 according to one embodiment. The system 200 may include: a pre-filter 104, a RF front-end 101, a frequency conversion unit 107, a local oscillation circuit (LO) 110, a baseband demodulation circuit 114, a pre-filter 104 and a tuning calibration circuit 150. The system 200 may be applicable to any receiver tuning control.

The pre-filter 104 may include a tunable device. The tunable device may be a variable capacitor 146, a variable inductor, a varactor, a variable resistor, a variable voltage microelectromechanical system (MEMS) or other frequency adjusting devices. The tunable device may be any combination of the variable capacitor 146, the variable inductor, the varactor, the variable resistor, and the variable voltage MEMS. For example, the capacitance value of the variable capacitor 146 may be changed according to a tuning signal 160, thereby changing the reception frequency of the pre-filter. The adjustment may be performed either through a digital signal for digital adjustment, or through an analog signal for continuous adjustment.

The tuning calibration circuit 150 may include an oscillation amplitude control circuit 142, an oscillation frequency control circuit 140, an oscillator negative resistance device 144, and a tuning control switch 152.

Figure 8:
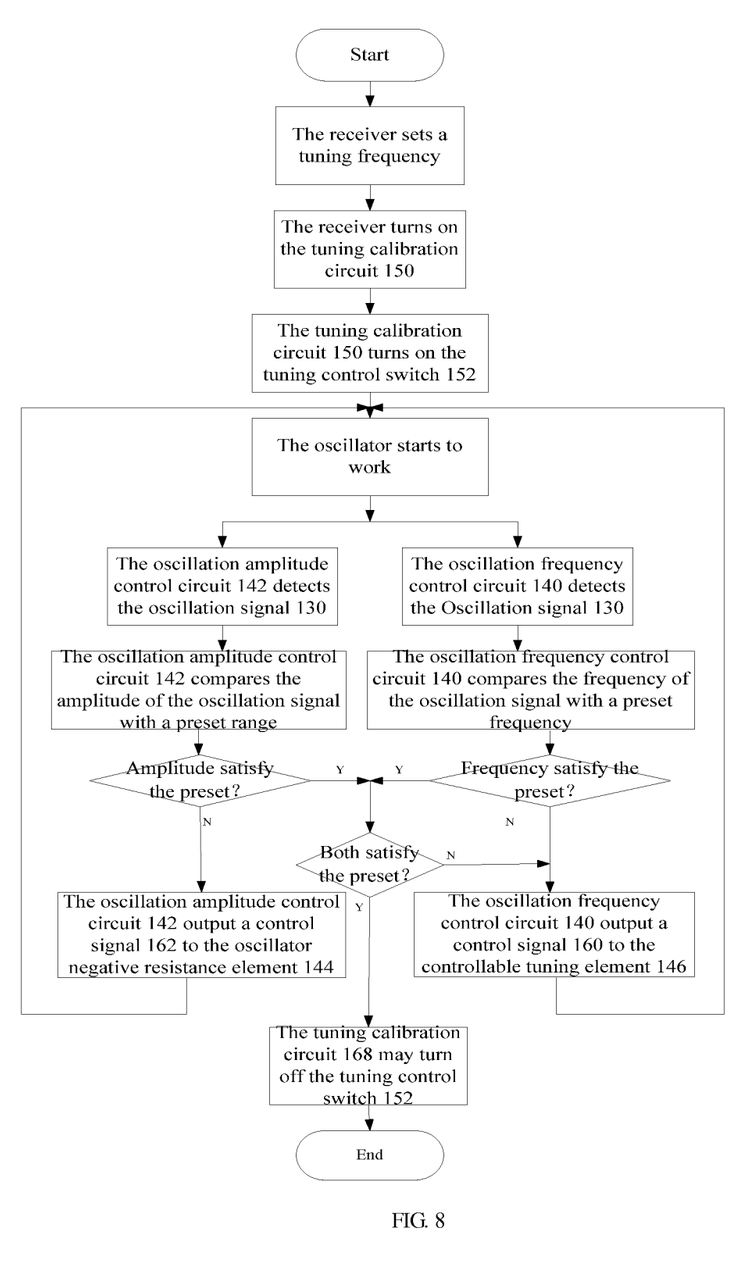
FIG. 8 is a flow chart showing a method for tuning the system 200 in FIG. 4.

FIG. 8 illustrates the tuning method of the system 200 according to one embodiment. When the receiver needs tuning, the receiver may first set a tuning frequency. Then the tuning calibration circuit 150 may start working. The tuning calibration circuit 150 may turn on the tuning control switch 152 through a signal 168. Thus, the oscillator negative resistance device 144 and the pre-filter 104 together may constitute an oscillator. The oscillation signal frequency may be the reception frequency of the pre-filter. The negative resistance device 144 may be one device or a plurality of devices, controlled by an amplitude control signal 162 output by the oscillation amplitude control circuit 142. The oscillation signal may be simultaneously input to the oscillation frequency control circuit 140 and the oscillation amplitude control circuit 142. The oscillation amplitude control circuit 142 may compare the oscillation signal with a preset range of the receiver system, the oscillation amplitude control circuit 142 may output a control signal 162 to the oscillator negative resistance element 144 to stabilize the amplitude of the RF signal 130 within the preset range according to the comparison result. The oscillation frequency control circuit 140 may detect the frequency of the oscillation signal 130, compare the frequency with a preset tuning frequency, and output a control signal 160 to the controllable tuning element of the pre-filter 104 to stabilize the frequency of the signal 130 within the preset range according to the comparison result. The operations continue until the amplitude and the frequency of the oscillation signal are within the preset range. At this point, the tuning is complete. The tuning calibration circuit 168 may turn off the tuning control switch 152 and the receiver starts normal operation. In one embodiment, in the flow chart illustrated in FIG. 8, the following steps may not be included: the oscillation amplitude control circuit 142 may compare the oscillation signal of with a preset range of the receiver system, and the oscillation amplitude control circuit 142 may output a control signal 162 to the oscillator negative resistance element 144 to stabilize the amplitude of the RF signal 130 within the preset range according to the comparison result. During the normal operation of the receiver, the pre-filter 104 and the negative resistance element 144 of tuning calibration circuit 150 may be disconnected, the pre-filter 104 may filter only the received radio signal and the oscillation frequency control circuit 140 may keep the control signal of the tunable element constant.

The above-mentioned signals can be analog signals, or digital signals, to indicate a voltage or a current.

Various illustrative modules, circuits, structures and algorithm steps according to the embodiments described herein may be implemented as an electronic hardware, or software, or combination of both. The person skilled in the art may decide the specific implementation according to a specific application. However, such embodiments should not be construed as departing from the scope of the present invention.

The embodiments described herein including the circuits, and the algorithm steps may be implemented in a circuit, or a software module executed by a processor, or the combination of both. The circuit may be a digital circuit state machine, an analog circuitry, or the combination of both. The processor may be a microprocessor, or any conventional processor and controller.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A circuit for a front-end tunable filter of a communication and broadcast receiver, comprising:
    a pre-filter comprising a tunable element;
    a tuning calibration circuit comprising an oscillation frequency control circuit, an negative resistance element, and a tuning control switch configured to connect said pre-filter with said negative resistance element;
    wherein in process of tuning said pre-filter, said receiver sets a tuning frequency, said tuning calibration circuit turns on said tuning control switch, said pre-filter and said negative resistance element form an oscillator; said oscillation frequency control circuit outputs a control signal to said tunable element according to the frequency of an oscillation signal detected and the tuning frequency to keep the frequency of the said oscillation signal in a pre-determined range.

2. The circuit according to claim 1, wherein the tunable element is a capacitor, or an inductor, or a diode, or a resistor, or a micro-electromechanical system (MEMS), or any combination of the capacitor, the inductor, the diode, the resistor, and the MEMS.

3. The circuit according to claim 1, wherein in the normal operation of the receiver, said tuning calibration circuit turns off said turning control switch, said pre-filter and the negative resistance element is disconnected to filter the received radio signal.

4. The circuit according to claim 1, wherein the tuning calibration circuit further comprises an oscillation amplitude control circuit, in process of tuning said pre-filter, said oscillation amplitude control circuit outputs a control signal to said negative resistance element according to the amplitude of the oscillation signal detected to keep the amplitude of said oscillation signal within a pre-determined range.

5. The circuit according to claim 1, wherein the oscillation frequency control circuit keeps the control signal for the tunable element constant in the normal operation of the receiver.

6. The circuit according to claim 1, wherein the tuning calibration circuit is independent of the signal reception link of the receiver.

7. The circuit according to claim 1, wherein the receiver is zero-IF, low-IF, high-IF, or multi-IF circuit topology.

8. The circuit according to claim 1, wherein the tuning calibration circuit is implemented by discrete electronic components, or implemented by an integrated circuit, or implemented by the combination of discrete electronic components and an integrated circuit.

9. A tuning method by the circuit according to claim 1, comprising:

setting a tuning frequency by said receiver;

turning on said tuning calibration circuit for operation by said receiver;

connecting said pre-filter with said negative resistance element to start controlled oscillation;

detecting the frequency of an oscillation signal, outputting a control signal to said tunable element according to the frequency of the oscillation signal detected and the tuning frequency to keep the frequency of said oscillation signal in a pre-determined range by said oscillation frequency control circuit;

disconnecting said pre-filter from said negative resistance element after tuning is complete.

10. The tuning method according to claim 9, wherein after turning on said tuning calibration circuit for operation by said receiver and before tuning is complete, further comprising:

detecting the amplitude of said oscillation signal, outputting a control signal to said negative resistance element according to the amplitude of the oscillation signal detected to keep the amplitude of said oscillation signal with a pre-determined range by an oscillation amplitude control circuit.

* * * * *